(12) United States Patent
Shimoji

(10) Patent No.: US 6,528,388 B2
(45) Date of Patent: Mar. 4, 2003

(54) METHOD FOR MANUFACTURING SEMICONDUCTOR DEVICE AND ULTRATHIN SEMICONDUCTOR DEVICE

(75) Inventor: Noriyuki Shimoji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/098,339

(22) Filed: Mar. 18, 2002

(65) Prior Publication Data

US 2002/0093012 A1 Jul. 18, 2002

Related U.S. Application Data

(62) Division of application No. 09/788,359, filed on Feb. 21, 2001, now Pat. No. 6,384,422.

(30) Foreign Application Priority Data

Feb. 21, 2000 (JP) ........................................ 2000-043075

(51) Int. Cl.$^7$ .............................................. H01L 21/76
(52) U.S. Cl. ...................................................... 438/409
(58) Field of Search ................................ 438/455, 409, 438/400, 406

(56) References Cited

U.S. PATENT DOCUMENTS

| | | | |
|---|---|---|---|
| 6,136,684 A | * 10/2000 | Sato et al. ................. | 438/624 |
| 6,194,245 B1 | 2/2001 | Tayanaka .................... | 438/57 |
| 6,221,738 B1 | * 4/2001 | Sakaguchi et al. .......... | 438/455 |
| 6,337,288 B1 | * 1/2002 | Ohya et al. ................. | 438/758 |
| 6,380,046 B1 | * 4/2002 | Yamazaki .................... | 438/409 |

* cited by examiner

*Primary Examiner*—David Nelms
*Assistant Examiner*—Thao P Le
(74) *Attorney, Agent, or Firm*—Arent Fox Kintner Plotkin & Kahn

(57) ABSTRACT

(a) At first a semiconductor substrate (11) having a lacunose layer (12) disposed at a equal depth (h) from the surface of a semiconductor layer (1) is formed; (b) then electric components (2), for example, transistors, or lines (3) for an electric circuit are formed on the semiconductor layer (1) at the surface side with respect to the lacunose layer (12); (c) then the semiconductor substrate is separated at the lacunose layer; (d) and an insulating layer (5) is formed on the surface exposed by the separation. The ultrathin semiconductor device has a thickness lower than 20 micro meters. As a result, a thin semiconductor device, having an SOI structure, for example can be fabricated, without the electric components and the insulating layer being influenced by charging up, which may appear during the manufacturing process. And it is also possible to realize a three dimensional semiconductor device.

7 Claims, 3 Drawing Sheets

METHOD FOR MANUFACTURING SEMICONDUCTOR DEVICE AND ULTRATHIN SEMICONDUCTOR DEVICE

This is a Division of application Ser. No. 09/788,359 filed Feb. 21, 2001 now U.S. Pat. No. 6,384,422. The disclosure of the prior application(s) is hereby incorporated by reference herein in its entirety.

FIELD OF THE INVENTION

The present invention relates to a method for manufacturing a semiconductor device, in which electric components are formed on a thin semiconductor layer of an SOI substrate, and to an ultrathin semiconductor device. In particular, it relates to a semiconductor device manufacturing method, which allows to form electric components on a very thin semiconductor layer, such as an SOI structure, without causing neither electric component destruction nor damage of oxidized layer due to the charging up by the plasma in the manufacturing process, and the present invention relates also to an ultrathin semiconductor device.

BACKGROUND OF THE INVENTION

Conventionally, semiconductor devices using SOI substrate have various advantages, such that the electric components can be isolated from each other without using p-n junctions, that the leak current is small and that the capacitance is small because electric components can be formed on a thin semiconductor layer disposed on an insulating layer, therefore, the operation speed of the semiconductor devices can be increased, and the degree of electric component integration can be increased. Thus, semiconductor devices using SOI substrate are used in high integrated semiconductor devices. Such semiconductor devices are manufactured using a wafer, which is prepared such that an isolating layer is formed between semiconductor layers as an SOI substrate.

Such an SOI substrate has been prepared by various methods, such as an combining method, oxygen implantation method, ELTRAN (Epitaxial Layer Transfer) method, and smart-cut method. In the combining (applying) method, two Si substrate are prepared; then an insulating layer, for example, $SiO_2$, is formed on one of the two substrates; then they are applied to each other, and one of those Si substrates is ground to be thin. In the oxygen implantation method, oxygen ions are implanted up to a certain depth from the surface of a Si substrate so that an insulating layer, such as $SiO_2$, is formed up to the depth from the surface.

In the ELTRAN method, a porous surface is formed on a Si substrate by an anode oxidization procedure, for example, then an epitxial semiconductor layer is grown on the porous surface. Another semiconductor substrate, on which an oxidized layer is formed, is combined (applied) on the surface of the epitaxial grown semiconductor layer of the former Si substrate, then the Si substrate portion is separated at the porous surface so that this portion is removed. And electric components are formed on the epitaxial grown semiconductor layer. In the smart-cut method, two substrates are prepared. Then, hydrogen ions are implanted into one of the substrates, and an oxidized layer is formed on the surface of the other substrate. Then they are applied to each other. After that, a heat treatment is undergone. The portion where hydrogen ions are implanted swells by the heat treatment so that the substrates are cut out at the portion.

In the process for manufacturing a semiconductor device using an SOI substrate, according to the prior art, as explained above, an SOI substrate is prepared previously before the so-called wafer process. Namely electric components are formed on a thin semiconductor layer, which is disposed on an insulating layer in the SOI substrate. This means that the thin semiconductor layer is electrically floating in the process, and the so-called charging up phenomenon occurs. The charging up phenomenon is a phenomenon that charges due to, for example, the plasma in the process of etching, CVD or ion implantation, accumulate in some portions. When an inverse electric field is formed by the accumulated charges, serious problems, such as destruction of the electric components or damages in the oxidized layer, will appear.

When such SOI substrate is not used, intrinsic gettering cites, which are called "IG (intrinsic gettering)", are formed at a depth of over 20 micro meters from the surface of the semiconductor substrate 31, as shown in FIG. 5(a). The intrinsic gettering is a defect caused by precipitation of oxygen, and is also referred to "bulk macro defect (BMD)". Impurities such as Fe, for example, or charges due to the implanted ions I/I are gettered by those gettering cites. When SOI substrate is used, however, the gettering cites IG are insulated by the oxidized layer 32, thus the gettering cites IG can not getter the impurities, etc. And thickness of the semiconductor layer 33 disposed on the oxidized layer 32 is very thin, for example, 0.05 to 2 micro meters, as shown in FIG. 5(b). Therefore no gettering cite cannot be formed therein. By the way, in FIGS. 5(a) and 5(b), reference numeral 34 denotes an electric component such as transistor and the reference numeral 35 denotes an insulating layer of the surface on the substrate 31.

According to the manufacturing method of a semiconductor device using SOI substrate, in the prior art, though the thickness of the semiconductor layer itself disposed on an insulating layer is formed to be thin, only a semiconductor device having a thickness of over 30 micro meters can be obtained. Because such semiconductor device is formed either on a Si substrate, on which an insulating layer is formed, or on a sapphire substrate, on which a semiconductor layer is formed. Thus, even when the silicon substrate is ground to be thin, there is a limit to decrease the thickness, due to the difficulty in the thinning of the substrate after forming electric components on such thick substrate. Thus, no semiconductor device thinner than 30 micro meters is obtained using such SOI substrate so far now. Another problem is that such SOI substrate is not suitable for putting on a plurality of such semiconductor devices one over another so as to produce a three dimensional semiconductor device.

SUMMARY OF THE INVENTION

An object of the present invention is to provide a manufacturing method of a semiconductor device using a SOI substrate, which allows to form electric components on a thin semiconductor substrate having SOI structure, while the electric components or the insulating layer are not influenced by the charging up phenomenon, which may appear in the manufacturing process.

Another object of the present invention is to provide an ultrathin semiconductor device having an insulating layer at its backside, the total thickness of which is under 20 micro meters, and which can be easily putted on (layered) one over another to form a three dimensional semiconductor device.

The method for manufacturing a semiconductor device is characterized by: (a) a step for forming a semiconductor substrate having a lacunose layer disposed at a equal depth from the surface of a semiconductor layer; (b) a step for forming electric components on the semiconductor layer at the surface side with respect to the lacunose layer; and (c) a step for separating the semiconductor substrate at the lacunose layer, after forming the electric components. An insulating layer is formed on the surface exposed by the separation of the semiconductor substrate at the lacunose layer, so that a semiconductor device having SOI structure is formed.

The lacunose layer in this description means a layer where the substrate can be easily separated into two parts. An example of a lacunose layer is, for example, a porous layer obtained by an anode oxidation of a silicon substrate. The substrate can be separated at the layer, by blasting a water jet or by $N_2$ gas. Another example is a hydrogen ion implanted layer. The substrate can be separated at the layer, by generating foam due to a heat treatment. The electric component in this description means electric elements forming a part of an electric circuit, which are formed on and/or in the semiconductor layer. Examples of the electric component are transistor, memory element, diode, resistor, capacitor and lines.

According to this method, though electric components can be formed on a thin layer as if they are formed on a conventional SOI substrate, the electric components forming process can be carried out at a state that the semiconductor substrate is not electrically floating. Therefore, the electric component destruction or the damage of the insulating layer due to the plasma during the process does not occur, and charges or impurities can be gettered by gettering cites in the substrate so that high quality semiconductor devices can be produced. Further, an ultrathin semiconductor device having a total thickness of under 10 micro meters, the semiconductor device therein has an SOI structure, can be obtained, by disposing an insulating layer on the surface exposed by the separation of the semiconductor substrate at the lacunose layer in the backside thereof. Moreover a transistor having a very small serial resistance can be obtained as a discrete transistor, by disposing an electrode layer on the exposed surface of the semiconductor device, and by bonding directly the electrode with the substrate.

By the way, the insulating layer or the electrode layer can be disposed on the exposed surface as follows. After the completion of the electric components formation process, a supporting substrate is formed. The supporting substrate can be formed by applying a supporting tape for supporting the semiconductor layer or a glass plate, for example, quartz, on the front side of the semiconductor layer, or by covering the front side with poly-imide resin and curing it. Under the supporting by the supporting substrate, the semiconductor substrate is separated at the lacunose layer, then the insulating layers or the electrode layers are disposed on the exposed surface, subsequently. Finally the semiconductor devices are divided into chips, namely, an ultrathin semiconductor device can be obtained.

The semiconductor substrate having a lacunose layer, referred to in the step (a), can be prepared, for example, by making a porous surface on a silicon substrate by anode oxidation, and growing an epitxial semiconductor layer on the porous surface so that the porous portion becomes a lacunose layer, or by implanting hydrogen ions up to a certain equal depth from the surface of a silicon substrate so as to form foam so that the foam portion becomes a lacunose layer.

It is preferable to control the characteristics of the interface, by oxidizing the Si, which is exposed on the surface of the separation at the lacunose layer, at low temperature, or by oxidizing the same using $O_3$ or $H_2O_2$, before the insulating layer forming process.

It is preferable to employ the plasma CVD method or SOG method (in which the oxide is solved into solvent, then is spin coated and finally the solvent is evaporated by a heat treatment), for forming the insulating layer. Because it is possible to carry out those methods without increasing the temperature so high. Thus, the electric components are not so influenced by the temperature.

It is preferable to form gettering cites previously in the semiconductor substrate so that impurities such as Fe or charges due to the ion implantation in the manufacturing process can be gettered.

The ultrathin semiconductor device according to the present invention comprises a semiconductor layer formed to have a thickness of below 15 micro meters, an electric component disposed on this semiconductor layer and an insulating layer formed at the backside of the semiconductor layer, and the total thickness from the insulating layer to the circuit lines layer on the front side of the semiconductor layer is below 20 micro meters. Such ultrathin semiconductor device can be obtained, for example, by following steps: forming electric components on a semiconductor substrate, which has an aforementioned lacunose layer at its surface side with respect to the lacunose layer; then separating the semiconductor substrate at the lacunose layer; and finally disposing an amorphous insulating layer, such as silicon oxide or silicon nitride, on the surface exposed by the separation, using the CVD method or SOG (spin on glass) method.

A three dimensional semiconductor device can be obtained, by putting on a plurality of such very thin semiconductor elements one over another. Namely a large scale integrated semiconductor device (LSI) comprising a large number of electric components but requiring small surface area can be obtained. Moreover, it is possible to obtain an ultrathin semiconductor device as a discrete electric component having an electrode at its backside, such as a large current transistor, by forming an electrode on the backside of the semiconductor layer.

DETAILED DESCRIPTION

The semiconductor device manufacturing method according to the present invention is explained below. The method according to the present invention is carried out as shown in FIGS. 1(a) to 1(d).

Figure 1A:
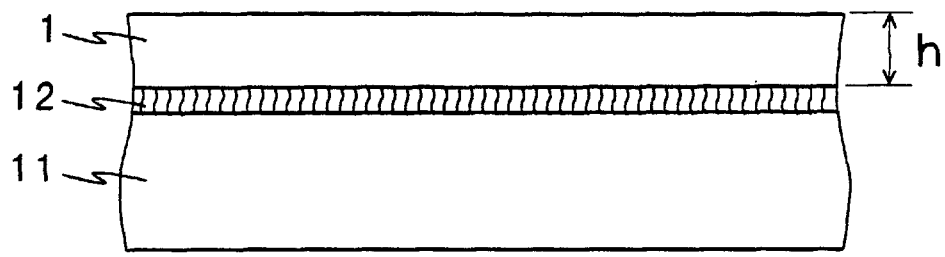
FIGS. 1(a) to 1(d) are cross sectional views of a semiconductor device, showing the process of an embodiment of the semiconductor device manufacturing method of the present invention.
Figure 1B:
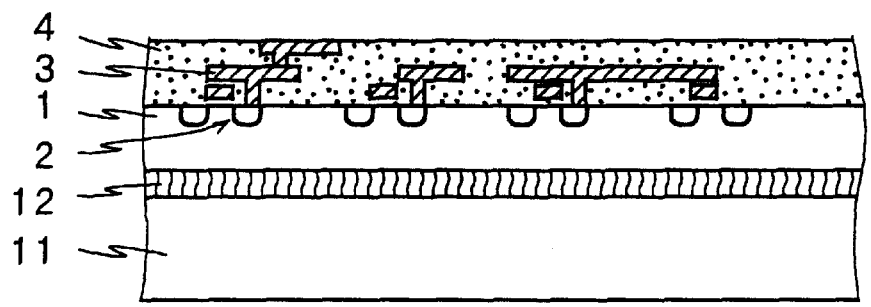
Figure 1C:
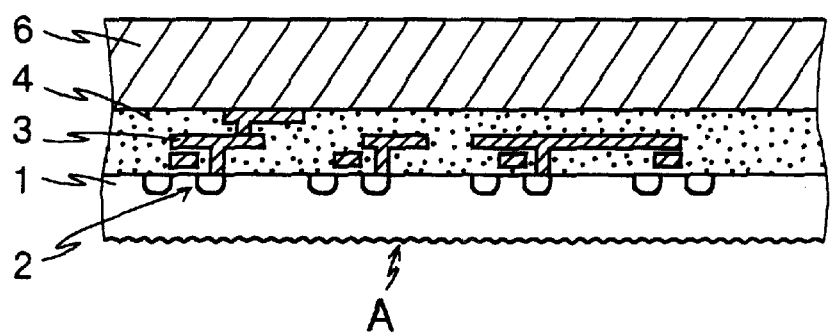

At first, a semiconductor substrate 11 having a lacunose layer 12 at a certain equal depth h from the surface of a semiconductor layer 1 is prepared, as shown in FIG. 1(a). And electric components 2, such as transistor, or circuit lines 3 are formed in the semiconductor layer 1, which is the surface side portion with respect to the lacunose layer 12, as shown in FIG. 1(b). Then the semiconductor substrate 11 is separated or divided at the portion of the lacunose layer 12, as shown in FIG. 1(c) so that the semiconductor device according to the present invention is produced.

Figure 1D:
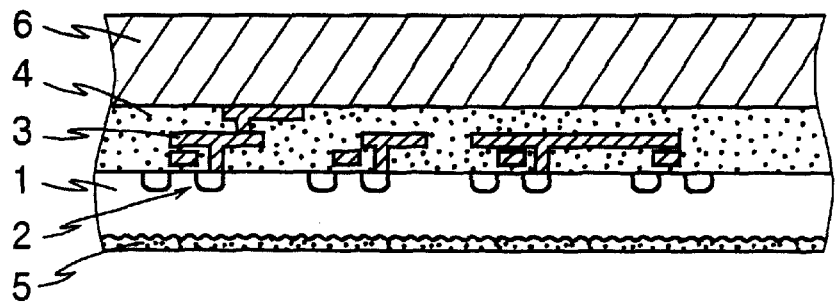

When an insulating layer have to be formed on the backside, for example, in case that the semiconductor device is an IC, an insulating layer 5 is formed on the back surface of the semiconductor layer 1 exposed by the separation, directly following the step of the separation of the substrate 11, so that a semiconductor device having SOI structure can be obtained, as shown in FIG. 1(d). During the step for forming the isolating layer, the semiconductor layer 1, on the front surface of which the electric components 2 are formed, is supported by a supporting substrate 6. On the other hand, when the semiconductor layer 1 has to have an electrode, for example, in case that the semiconductor device is a discrete transistor, an electrode layer is disposed on the back surface thereof so that a very thin semiconductor device can be obtained. These processes are more precisely explained below.

Figure 2:
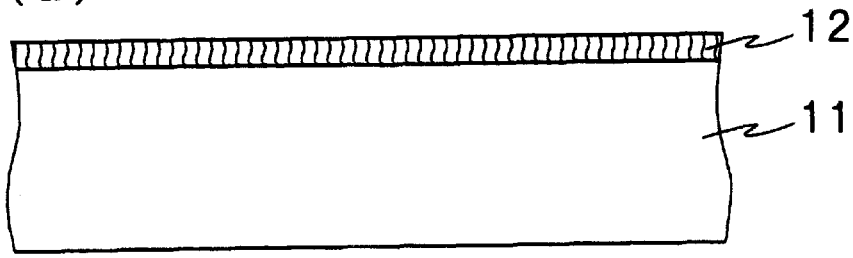
FIGS. 2(a) to 2(b) are cross sectional views showing an example of the process (a) in the process shown in FIG. 1.
Figure 2:
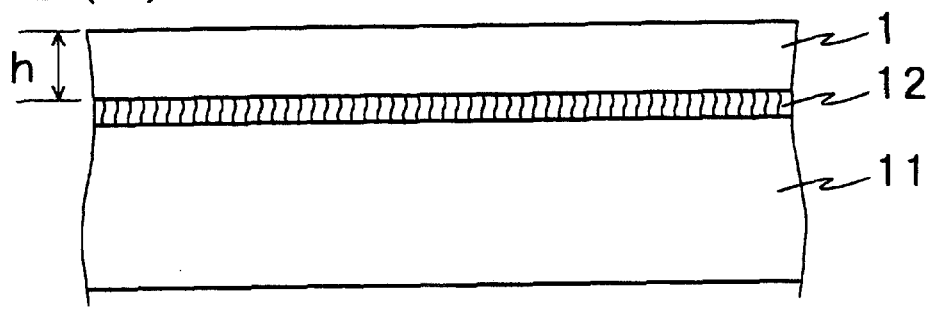

A semiconductor substrate 11 having a lacunose layer 12 can be prepared, for example, by a process shown in FIG. 2(a). At first, a semiconductor substrate, which is comprised of silicon, for example, and exposes a surface of the semiconductor substrate 11, is immersed into electrolytic solution HF. Then a voltage is imposed so that the semiconductor substrate is positive. Thus, a porous layer 12 is obtained by the anode oxidation, as shown in FIG. 2(a). Next, an epitxial semiconductor layer 1 having a thickness h of 0.05 to 5 micro meters is grown on the surface, as shown in FIG. 2(b). The porous portion 12 due to the anode oxidation is lacunose. This is a lacunose layer, which can be easily separated by a water jet or by blowing of $N_2$, so this layer becomes a cutting layer. By the way, as to the growing of the semiconductor layer on the porous portion 12, when an appropriate cleaning process is undergone to the surface, it is possible to grow a semiconductor layer on the surface commonly as a conventional epitxial growing.

Figure 3:
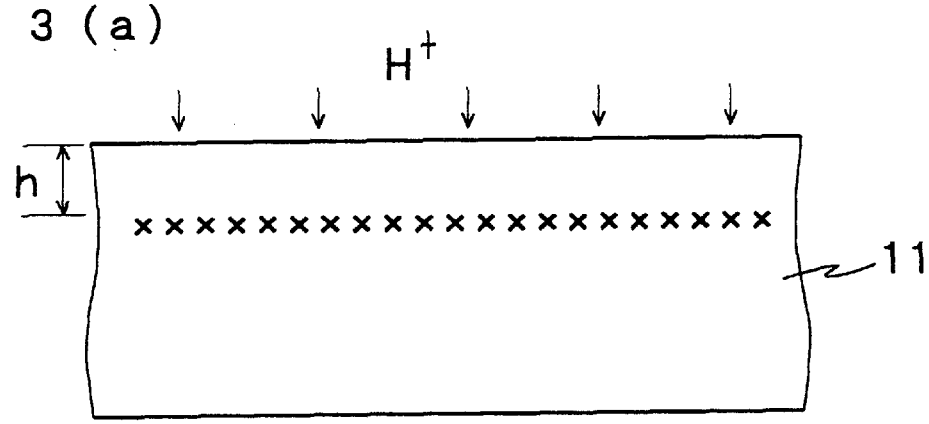
FIGS. 3(a) to 3(b) are cross sectional views showing another example of the process (a) in the process shown in FIG. 1.
Figure 3:
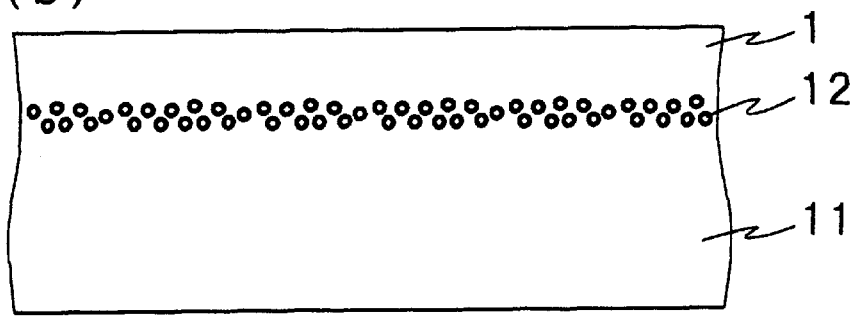

Another method to prepare a semiconductor substrate 11 having a lacunose layer 12 is shown in FIGS. 3(a) to 3(b). At first, hydrogen ions $H^+$ having energy to be implanted up to certain depth h, for example, 0.05 to 2 micro meters, are implanted from the overall surface of the semiconductor substrate 11 to up to an equal depth, as shown in FIG. 3(a). Then the semiconductor substrate is heat treated at 400 to 600° C. during about 30 minutes. As a result, a lacunose layer 12 comprising foam is formed, as shown in FIG. 3(b). Thus, the upper portion 1 of the semiconductor layer 11 becomes a portion which can be discriminated from the semiconductor substrate body 11. Consequently, this lacunose layer 12 can be a cutting layer. Namely, the portion of the semiconductor layer 1 can be separated easily from the semiconductor substrate 11, by a heat treatment of a rather lower temperature, for example, at 500° C.

Using either of the aforementioned methods, a lacunose layer 12 can be formed between the semiconductor substrate 11 and the semiconductor layer 1, and the semiconductor layer 1 can be easily separated from the semiconductor substrate 11, afterward. However, the former one allows to form the semiconductor layer as an epitaxial grown surface, which will become a electric components forming region.

And, the high quality epitxial grown layer can be used as an electric components forming semiconductor layer. Consequently, the characteristics of the electric components can be improved.

Next, as shown in FIG. 1(b), electric components and Al lines 3 as well as insulating layer 4 are formed on and in the semiconductor layer 1 disposed on the lacunose layer 12. The electric components include for example, transistors 2, resisters, capacitors or memory elements, which are forming a part of an electric circuit but not all of them are not shown in the drawing. The Al lines 3 connect electrically those electric components. The insulating layer 4 insulates different layers. The electric components 2, lines 3 and the insulating layer 4 can be formed, using material and process common to the conventional method of manufacturing a semiconductor device.

Then a supporting substrate 6, for example, a supporting poly-imide tape, is applied over the whole surface of the semiconductor layer 1 at the side where the electric components 2 are formed, as shown in FIG. 1(c). Rotating the wafer supported by the supporting substrate 6, water jet is blown to the lacunose layer 12 from the side direction of the wafer, so that the semiconductor layer 1 is separated from the semiconductor substrate 11 at the lacunose layer 12. The exposed surface A of the semiconductor layer 1, which appeared by the separation, is coarse due to the lacunose layer 12. However, this surface does not relate to the formation of the electric components, thus it is not the matter. By the way, in place of the supporting tape, a glass substrate, made from quartz, for example, or a poly-imide resin applied to and cured on the semiconductor layer can be employed as a supporting substrate 6.

When the semiconductor device to be produced has a structure that electrode is not disposed at its backside, for example, like an IC, an insulating layer 5 having a thickness of 0.05 to 1 micro meters is disposed on the exposed surface A of the separated wafer, as shown in FIG. 1(d). Holding the wafer through the supporting substrate 6, an insulating layer 5, $SiO_x$ or $SiN_y$, is disposed on the surface A by the plasma CVD method or normal pressure CVD method. The insulating layer 5 can be disposed on the surface A also by the SOG method, in which oxidized layer is spin coated and dried. On the other hand, when the semiconductor device to be produced has a structure that an electrode is disposed at its backside, for example, a discrete transistor, a thin layer of Al or Au as an electrode, in place of the insulating layer 5, is disposed by vacuum evaporation. This insulating layer disposing process is carried out after the forming of the electric components, thus it may not be preferable to increase the temperature excessively during this process. Thus, it is preferable to employ the plasma CVD method or SOG method, in which oxides are solved in solvent, spin-coated and heat-treated so as to remove the solvent. It is possible to control the characteristics of the interface, by an oxidation of Si, or by an oxidation by $O_3$ or $H_2O_2$ before the insulating layer disposing process. Then the dicing process is carried out to divide into chips so as to be used.

The ultrathin semiconductor device according to the present invention has a structure, as shown in FIG. 1(d), that electric components 2 are formed on a semiconductor layer 1 having a thickness of under 15 micro meters, and an insulating layer 5 is disposed on the backside surface of the semiconductor layer 1. And no other substrate is used, thus the total thickness of the semiconductor device can be under 20 micro meters. This characterizes the semiconductor device of the present invention. The electric components are comprised of only an epitaxial grown semiconductor layer or a like, and the thinness is attained not by grinding a semiconductor substrate. Thus, the semiconductor device according to the present invention can be an ultrathin semiconductor device, whose thickness is made thin to the limit, the flatness of the semiconductor device surface is excellent, and the electric characteristics of the electric components are not affected by the manufacturing process.

Figure 4:
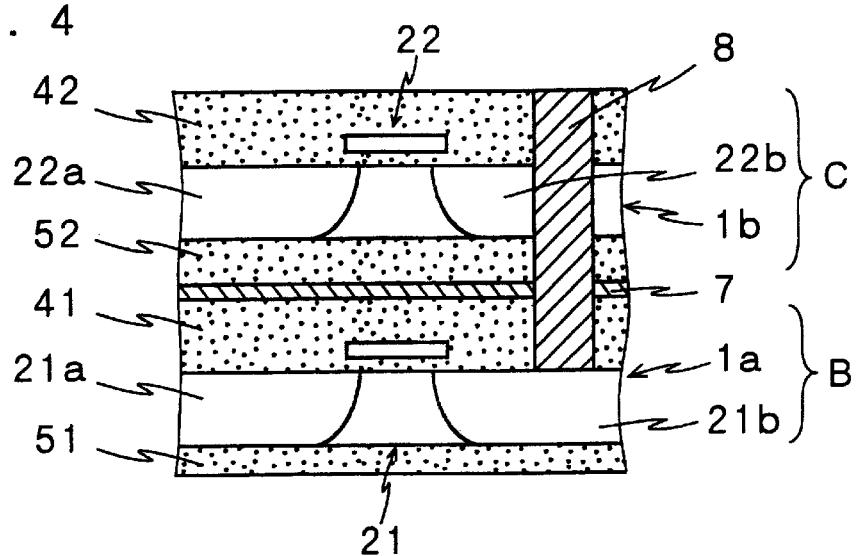
FIG. 4 is a cross sectional view of a semiconductor device having three dimension structure, which is an application of the ultrathin semiconductor device according to the present invention.
Figure 5A:
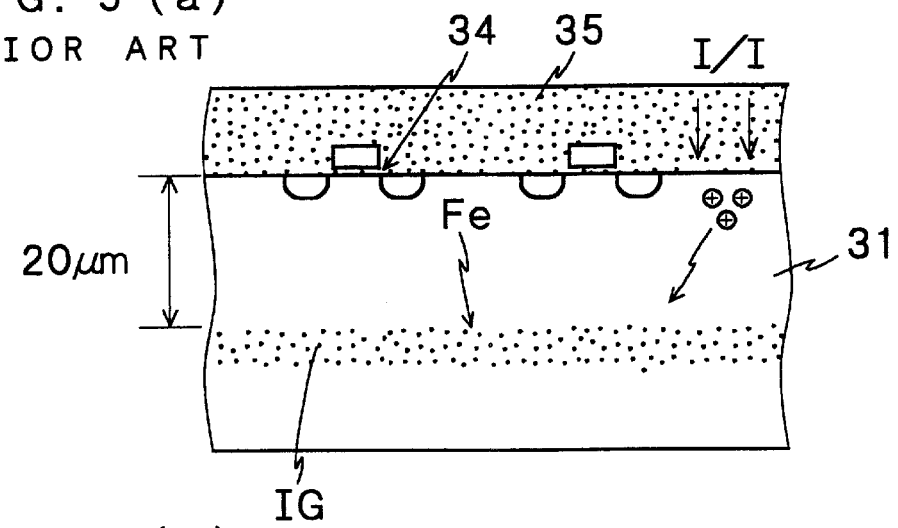
FIGS. 5(a) to 5(b) are cross sectional views of a semiconductor device using an SOI substrate in the prior art, for explaining the problems such as the charging up phenomenon.
Figure 5B:
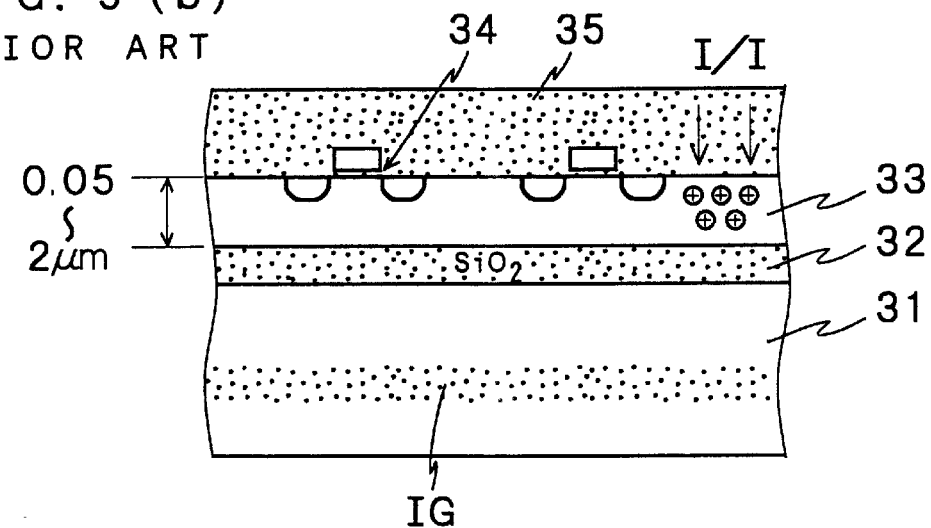

This ultrathin semiconductor device is comprised of only an epitaxial grown semiconductor layer 1, an insulating layer 4 on the front surface and an insulating layer 5 on the exposed surface at the backside, which appeared by the separation. Thus, the thinner the thickness of the semiconductor layer 1, so as to improve the characteristics, is made, the thinner the total thickness of the ultrathin semiconductor device is. In the example shown in FIG. 1(d), the electric components 2 are illustrated to be small compared to the thickness of the semiconductor layer. However, the source and drain areas of the transistor 2 can be designed to extend to the lacunose layer 12, by making thin the thickness of the semiconductor layer 1. And it is also possible to design so that the source and drain area 21a, 21b of the transistor 2 extend to the insulating layer 51, as illustrated in FIG. 4, which will be referred later. Employing such structure, various advantages are obtained, for example, parasite capacitances at the source/drain areas can be reduced and leak currents can be further reduced.

According to the present invention, in the process for forming electric components on the semiconductor layer, though a lacunose layer has already been formed, the semiconductor substrate is not separated by an insulating layer, thus, the electric components can be formed on the semiconductor substrate in the same manner as on a conventional semiconductor substrate. Therefore, even when a plasma is generated during the manufacturing process, charging up can be prevented and impurities does not rest in the semiconductor layer and are gettered by gettering cites, which can be disposed in the semiconductor substrate. Further, this semiconductor substrate (bulk) is finally removed from the semiconductor device, thus, a substrate with high density of $p^+$ or $p^{++}$ can be used, which will assist to suppress the charging up and enforce the gettering effect. The gettering cites can be generated in the state of the semiconductor substrate in the same manner as those formed in a wafer for use of manufacturing a conventional semiconductor device. For example, desired gettering cites can be formed by controlling the oxygen concentration in the process for making an ingot.

According to the present invention, the surface of a silicon substrate is made porous and an epitaxial grown semiconductor layer is formed on the porous surface, and the semiconductor layer is used for forming electric components, as is in the ELTRAN method, in which SOI substrate is formed. However, the present invention does not employ the process in the ELTRAN method, in which the another semiconductor substrate having an oxidized layer is applied onto the epitxial grown surface, then the porous portion is exposed by a division at the porous portion, and electric components are formed on the exposed surface. Therefore, it is not necessary to form electric components on the exposed surface, where the surface is not flat but is coarse. According to the present invention, precise electric components can be easily formed onto the outer most surface of the epitxial grown surface.

According to the ELTRAN method, the substrate applied to the epitaxial grown surface rests in the product of the semiconductor device. On the other hand, the product of the semiconductor device according to the present invention comprises almost only an epitaxial grown layer. The total thickness of the product containing the insulating layer can be lower than 20 micro meters. As to the thickness of the epitaxial grown layer itself, the thinner the thickness is, the more preferable is, in view of the production process as well as the electric characteristics. Semiconductor devices having a thickness of lower than 10 micro meters or further lower than 5 micro meters can be easily obtained. According to the prior art method, in which the backside of the substrate is ground, apart the problem that the grinding process requires a lot of works, the deterioration of the electric components due to the lack on the flatness was problematique. And it was not possible to obtain a semiconductor device having a thickness of lower than 30 micro meters.

When a discrete transistor is produced according to the prior art method, high concentration impurities such as antimony or arsenic have to be doped into the semiconductor substrate to decrease the serial resistance. And the doping of antimony or arsenic is difficult. However when such discrete transistor is produced as an ultrathin semiconductor device according to the present invention, the substrate used in the prior art can be omitted, therefore, the difficult doping of high concentration antimony or arsenic can be omitted. Additionally, also the electric characteristics are remarkably improved. And high speed and low power consumption semiconductor devices, which are desired in the domain of the portable appliances, such as cellular telephone, can be realized.

A three dimension semiconductor device can be formed from the ultrathin semiconductor devices according to the present invention, as illustrated in FIG. 4, by putting on (layering) and fixing such semiconductor devices one over another and by contacting mutually to each other. As shown in FIG. 4, a first semiconductor device B comprises a semiconductor layer 1a, in which a transistor 21 having a source/drain areas 21a, 21b and other electric components (not shown) are formed. A second semiconductor device C comprises a semiconductor layer 1b, in which a transistor 22 having source/drain areas 22a, 22b and other electric components (not shown) are formed. The first and second semiconductor devices are applied to each other by an adhesive 7, such as poly-imide. The drain area 21b and 22b are contacted by a plug 8. Reference numerals 41 and 42 denote insulating layers disposed on the surface of each electric device including inter layer insulating layers. Reference numerals 51 and 52 denote, respectively, insulating layers disposed onto the surface exposed by the separation at the lacunose layers.

An advantage of the present invention is that a semiconductor device having an excellent quality can be obtained, because destruction or deterioration of the electric components due to the charging up or impurities does not occur during the production process. Especially, when a porous surface is formed and an epitaxial grown layer is formed on the surface, an excellent epitaxial grown flat surface can be used as an electric components forming layer, therefore, it is possible to obtain a semiconductor device having an SOI structure with an excellent characteristics.

Another advantage of the present invention is that it is not necessary to form an SOI substrate, in which an insulating layer is formed between semiconductor layers. Therefore, complicated processes, such as a process for applying substrates to each other, can be omitted. The basic fabrication cost of such semiconductor device can be reduced to one tenth of that of the prior art. As a result, a remarkable cost down is possible. Namely, it is possible to fabricate semiconductor devices having an SOI structure or an ultrathin semiconductor devices having an insulating layer, which is formed directly on the backside of those devices, can be fabricated with very low fabrication costs.

Although preferred examples have been described in some detail it is to be understood that certain changes can be made by those skilled in the art without departing from the spirit and scope of the invention as defined by the appended claims.

What is claimed is:

1. A method for manufacturing a semiconductor device comprising the steps of:
   (a) forming a semiconductor substrate having a lacunose layer disposed at a equal depth from the surface of a semiconductor layer;
   (b) forming an electric component on said semiconductor layer at the surface side in respect with said lacunose layer; and
   (c) separating said semiconductor substrate at said lacunose layer, after forming said electric component.

2. A method of claim 1, wherein an insulating layer is formed on the surface, which is exposed by the separation of said semiconductor substrate at said lacunose layer.

3. A method of claim 1, wherein said semiconductor substrate having said lacunose layer is formed, by making a porous portion on a surface of a silicon substrate by anode oxidation, and growing an epitaxial semiconductor layer on said porous portion so that said porous portion becomes said lacunose layer.

4. A method of claim 1, wherein said semiconductor substrate having a lacunose layer is formed, by implanting hydrogen ions so far a certain equal depth from the surface of a silicon substrate so as to form foam so that the foam portion becomes a lacunose layer.

5. A method of claim 2, wherein the semiconductor exposed on the surface of the separation at the lacunose layer is oxidized at a low temperature, or oxidized by $O_3$ or $H_2O_2$, then said insulating layer is formed.

6. A method of claim 2, wherein said insulating layer is formed using the plasma CVD method or the SOG method.

7. A method of claim 1, wherein gettering cites are formed previously in said semiconductor substrate.

* * * * *